United States Patent [19]

Kamei

[11] Patent Number: 5,229,351
[45] Date of Patent: Jul. 20, 1993

[54] PRESSURE DEVELOPMENT METHOD

[75] Inventor: Naoyuki Kamei, Yamatokoriyama, Japan

[73] Assignee: Sharp Kabushiki Kaisha, Osaka, Japan

[21] Appl. No.: 882,239

[22] Filed: May 8, 1992

Related U.S. Application Data

[63] Continuation of Ser. No. 512,196, Apr. 20, 1990, abandoned.

Foreign Application Priority Data

Apr. 24, 1989 [JP] Japan .................................. 1-104163

[51] Int. Cl.⁵ ............................................. B41M 5/128
[52] U.S. Cl. .................................... 503/201; 430/138; 503/215

[58] Field of Search ................ 428/195, 914; 430/138; 503/201, 215

[56] References Cited

FOREIGN PATENT DOCUMENTS 63-92954  4/1988  Japan .................................. 430/138

Primary Examiner—Pamela R. Schwartz
Attorney, Agent, or Firm—Nixon & Vanderhye

[57] ABSTRACT

A pressure development method is achieved by passing a sheet bearing a latent image through a pair of press rollers under non-pressure, stopping the conveyance of the sheet when an area of the sheet corresponding to the forward end of the latent image thereof reaches the nip between the pair of press rollers, applying pressure to the press rollers nipping the sheet, and rotating the press rollers so as to feed the sheet.

7 Claims, 6 Drawing Sheets

PRESSURE DEVELOPMENT METHOD

This is a continuation of application Ser. No. 07/512,196, filed Apr. 20, 1990, now abandoned.

BACKGROUND OF THE INVENTION

1. Field of the invention

The present invention relates to a method for effecting pressure development of a latent image on a photosensitive and pressure sensitive sheet, herein-after referred to as the photo-and-pressure sensitive sheet.

2. Description of the prior art

There is a generally known photo-and-pressure sensitive sheet that includes a first sheet coated with pressure-rupturable capsules containing chromogenic dyestuff and a second sheet coated with a developer. Hereinafter, this double sheet will be referred to as the composite sheet. The first sheet bears a latent image resulting from the exposure to light, and is overlaid with the second sheet. Finally the composite sheet is pressed together. As a result of this pressure the capsules rupture and the dyestuff flows out. The dyestuff colors together with the developer on the second sheet, thereby forming a colored image on the second sheet. The pressing of the sheets is performed by a pair of press rollers.

However, pressure development requires a high pressure to be applied to the composite sheet. Here arises a problem; that is, when the press rollers receive the composite sheet and release them, their torque is likely to change suddenly due to the thickness of the composite sheet inserted between the rollers. Especially when the press rollers receive the forward end of the sheet the change is large, and likely to spoil the forward end portion of the latent image. Even if the spoiled portion is in a small area of the image, it will be a fatal defect to the quality of the image.

SUMMARY OF THE INVENTION

The pressure development method of the present invention, which overcomes the above-discussed and numerous other disadvantages and deficiencies of the prior art, comprises the steps of passing a sheet bearing a latent image through a pair of press rollers under non-pressure, stopping the conveyance of the sheet when an area of the sheet corresponding to the forward end of the latent image reaches the nip between the pair of press rollers, applying pressure to the press rollers nipping the sheet, and rotating the press rollers so as to enable the sheet to advance.

According to another aspect of the present invention, the method comprises the steps of passing a double sheet through a pair of press rollers under nonpressure, the double sheet comprising a first sheet coated with pressure-rupturable containing dyestuff and a second sheet coated with a developing medium, the first sheet being adapted to bear a latent image as a result of exposure to light, stopping the conveyance of the double sheet when an area of the first sheet corresponding to the forward end of the latent image thereof reaches the nip between the pair of press rollers, applying pressure to the press rollers nipping the double sheet, and rotating the press rollers so as to feed the double sheet.

In a preferred embodiment, the method further comprises the step of heating the first sheet so as to keep the first sheet at constant temperature and maintain the photosensitivity thereof irrespective of variations in temperatures, wherein the heating is initiated in response to the exposure of the first sheet to light.

Thus, the invention described herein makes possible the objectives of (1) providing a pressure development method capable of development without spoiling an image on the sheet, and (2) providing a pressure development method in which the press rollers are not subjected to changes in torque which would be likely to occur when the sheet is nipped by the press rollers.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 3:
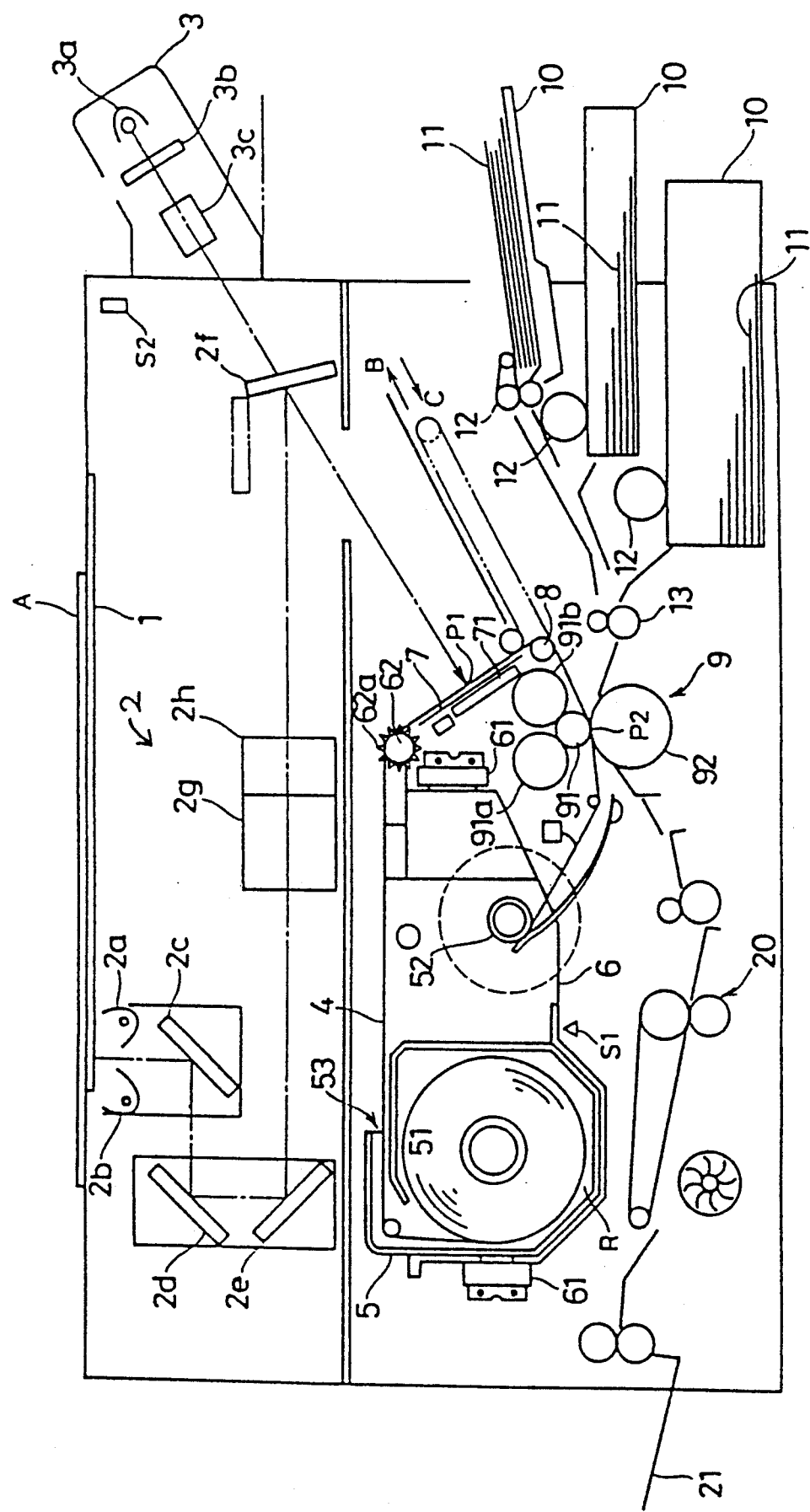
FIG. 3 is an overall schematic view showing an image forming apparatus for carrying out pressure development according to the present invention.

Referring to FIG. 3, an image forming apparatus using the composite sheet will be described by way of example:

The illustrated apparatus uses a rolled sheet for the first sheet and cut sheets for the second sheet stored in cassettes, which will be referred to below. The first sheet and the second sheet are individually fed to a pressure point P2 and meet together. The pressure point P2 is provided by the nip between the press rollers 91, 92. More specifically, when an area of the sheet corresponding to a forward end portion of the latent image on the first sheet and a forward end of the second sheet reaches the pressure point P2, the conveyance of each sheet is respectively stopped.

The reference numeral 1 denotes a glass panel on which an original (A) is placed face down, under which an optical system 2 is disposed. The optical system 2 includes light sources $2a$, $2b$, mirrors $2c$ to $2f$, a lens $2g$, and a filter unit $2h$. The original (A) is exposed to light from the light sources $2a$, $2b$, and the reflective light is led to an exposure point P1 through the mirrors $2c$ to $2f$, the lens $2g$ and the filter unit $2h$. The filter unit $2h$ includes a plurality of filters having different light-permeable wavelengths. Filters can be added or reduced so as to change the total number and effect chromatic compensation for the reflective light from the original (A). The number of the filters depends on the sensitivity of the first sheet and the image color density desired by the user.

The image forming apparatus is provided with a slide projector 3 in a detachable manner. The slide projector 3 includes a light source $3a$, a holder $3b$, and a lens $3c$. The holder $3b$ maintains slides to be printed. The mirror $2f$ can be rotated approximately 90° by means of a handle (not shown) disposed on the front side of the image forming apparatus. When the mirror $2f$ is shifted 90° as shown by dotted lines, a light led from the source $3a$ is directed to the exposure point P1 through a slide placed on the holder 3b and the lens 3c. Additional filters can be provided in the lens 3c for chromatic compensation.

The image forming apparatus is provided with a sheet loading section on which the first sheet 4 is made of a light-reflective substance such as aluminum foil, coated with pressure-rupturable capsules containing a chromogenic material and color dyestuff having a grain size of 10 to 20 μm. The pressure-rupturable capsules harden by exposure to light, and rupture under pressure to allow the color dyestuff to flow out. As referred to above, the first sheet 4 constitutes the composite sheet together with the second sheet 11.

The first sheet 4 is wound around a first roller 51, and is housed as a roll in an accommodation chamber (R) of a light-impermeable cartridge 5 so as to protect the first sheet 4 against light and pressure. The first roller 51 can be locked by a ratchet mechanism including a solenoid (not shown). The first sheet 4 is pulled from the cartridge 5 and wound around a second roller 52. The roller 52 is normally biased in the direction in which the first sheet 4 is wound so as to avoid the slackening of the sheet 4. The used first sheet 4 is replaced by a fresh roll on which a fresh first sheet is wound.

A fresh cartridge 5 is detachably fitted in a a bucket 6 which is releasably retained by holders 61. The bucket 6 is provided with sprockets 62 having teeth 62a which are engaged with holes in the first sheet 4. After the cartridge 5 is fitted in the bucket 6, the top end of the first sheet 4 is pulled out through an opening 53 produced in the cartridge 5 and is engaged with the sprockets 62. Normally the starting end of the first sheet 4 is provided with an extra lead sheet which is less pliable and slightly wider than the first sheet 4. The lead sheet also has holes at opposite edges in which the teeth 62a of the sprockets 62 fit. When the lead sheet is engaged with the sprocket 62 and the bucket 6 is mounted on the image forming apparatus, a sensor S1 fixed to the bucket 6 is on, and when a cover is closed over the apparatus, a sensor S2 is on. The "on" states of the two sensors S1, and S2 initiate the automatic loading of the first sheet 4 (the automatic setting of the first sheet 4).

Adjacent to the exposure point P1 there are provided an exposure plate 7, a buffer roller 8, and a pressure development unit 9. At the initial stage the first sheet 4 is passed through the exposure plate 7, the buffer roller 8 and the pressure development unit 9 and finally wound around the second roller 52. The exposure point P1 receives the light reflected from the original (A) or directed from the light source 3a through the slide placed on the holder 3b. In this way the first sheet is exposed to light and bears a latent image corresponding to an image in the original (A) or in the slide film, wherein the capsules harden by exposure to light. The reference numeral 71 denotes a heater which keeps the first sheet 4 at a constant temperature so as to maintain the photosensitivity thereof irrespective of variations in the outside temperatures.

Figure 4A:
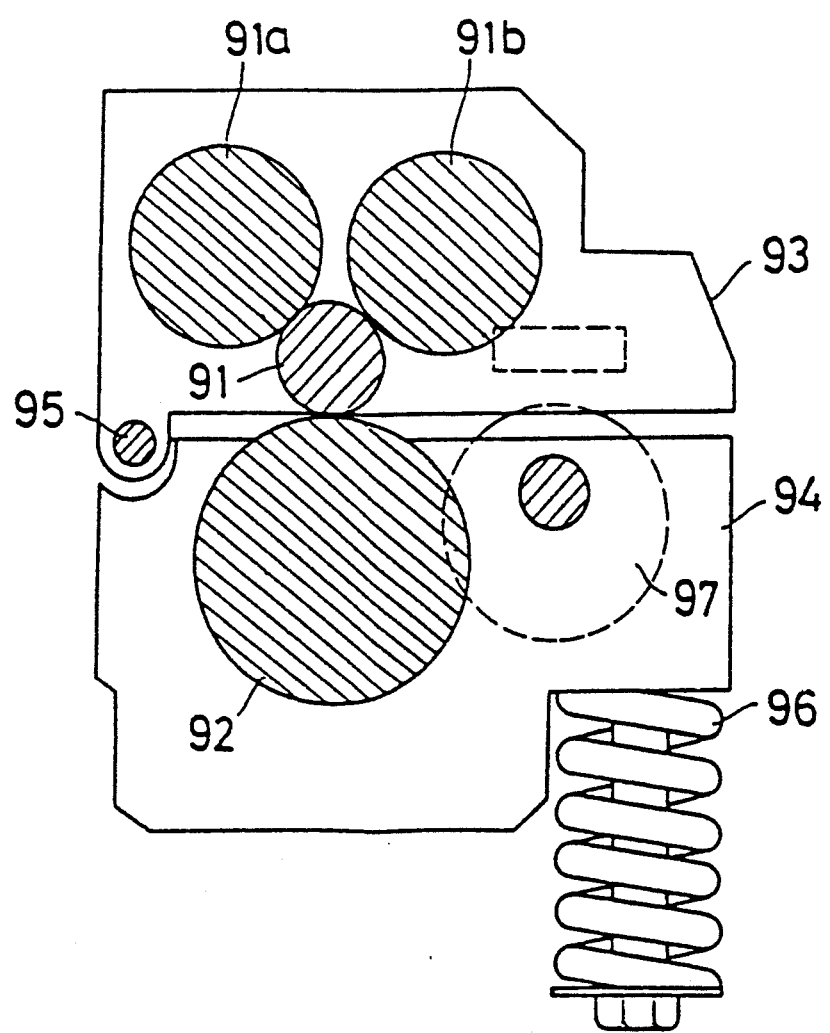
FIGS. 4A and 4B are diagrammatic views showing the pressure development unit on an enlarged scale when pressure is applied and when pressure is stopped, respectively.
Figure 4B:
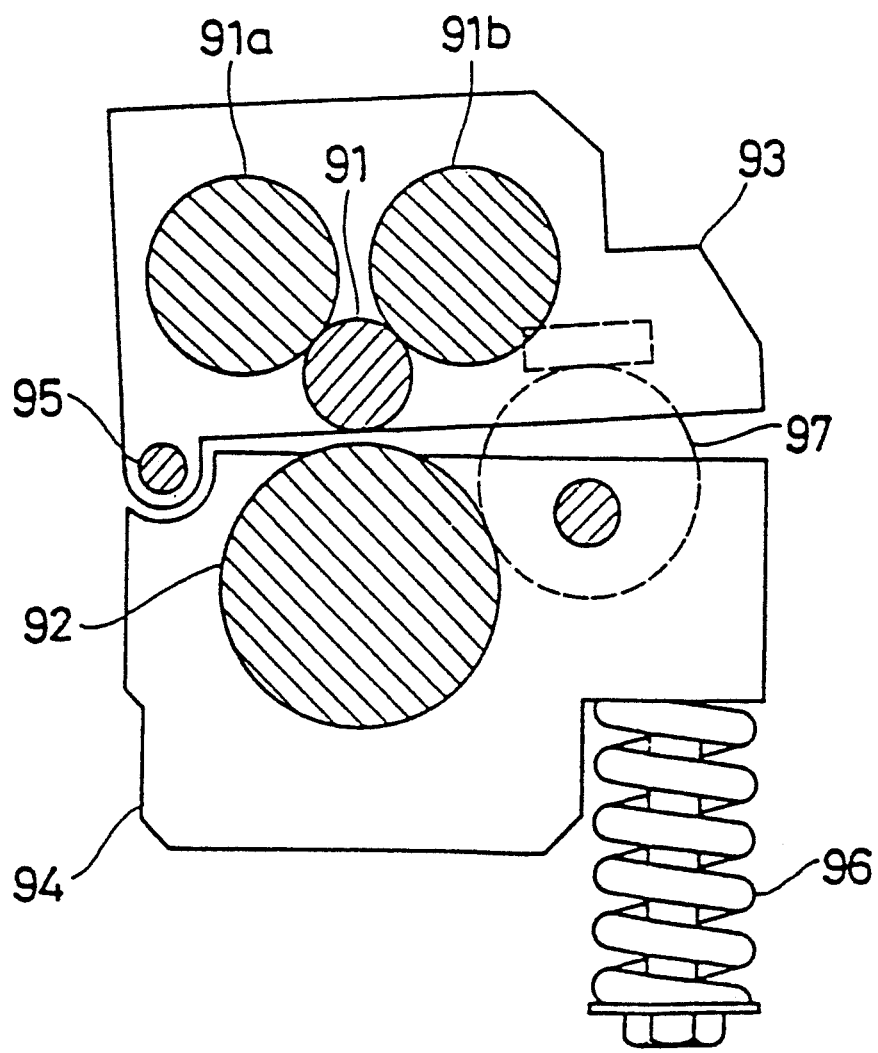

Referring to FIGS. 4A and 4B, the pressure development unit 9 will be described:

The pressure development unit 9 includes an upper press roller 91 and a lower press roller 92 having the pressure point P2. The upper press roller 91 is mounted on an upper holder 93 in such a manner as to be vertically movable against rotary backup rollers 91a, 91b. The lower press roller 92 is mounted on a lower holder 94 for rotation. The upper and lower holders 93 and 94 can rotate about a shaft 95. The applying and stopping of the pressure are controlled by a spring 96 and an eccentric cam 97. When the upper and lower holders 93 and 94 are placed under pressure, the press rollers 91 and 92 are also placed under pressure. When both holders 93 and 94 are released from pressure, the press rollers 91 and 92 are also released from pressure (FIG. 4B). The press rollers 91 and 92 are placed under pressure only when the pressure development is to be carried out but at other times they are released from pressure.

The buffer roller 8 is moved by a motor (not shown) in the direction of arrows (B) and (C) at the time of exposure. The illustrated image forming apparatus is designed to ensure that pressure development proceeds after the exposure is finished. The practice of the separate processes is advantageous in differentiating the speeds of process, which enhances the quality of the resulting image. The buffer roller 8 is used to differentiate the feeding speed of the first sheet, i.e. the speed at which the first sheet is exposed to light, and the speed at which it is subjected to pressure development. For exposure the buffer roller 8 is moved in the direction of arrow (B) and stays in this position for some time during which a portion of the first sheet 4 bearing the latent image is stored over the extended length. After the exposure is finished, the buffer roller 8 is returned in the direction of arrow (C), thereby feeding the image-bearing portion of the first sheet 4 to the pressure development unit 9, that is, the pressure point P2. At this stage the second sheet 11 is fed to overlay the image-bearing portion of the first sheet 4 to form the composite sheet, which is pressed at the pressure point P1 together.

The image forming apparatus is provided with cassettes 10 in which the second sheets 11 are stacked. The second sheets 11 are fed out by feed rollers 12, and stopped temporarily by timing rollers 13 so as to overlap the image on the first sheet 4.

When the composite sheet is pressed by the press rollers 91 and 92, the capsules rupture and the dyestuff flows out and colors by mixing with the developer on the second sheet 11. In this way a colored image is formed on the second sheet 11. The two sheets 4 and 11 are separated, and the first sheet 4 is wound around the second roller 52, and the second sheet 11 bearing the colored image is passed through a brightening device 20 at which the sheet 11 is heated and pressed so as to fluidify the dyestuff on the sheet. The fluid dyestuff spreads over the sheet and forms a film to provide a flat, smooth surface. The heating facilitates the coloring action. The finished sheet is discharged through an outlet 21.

Figure 1:
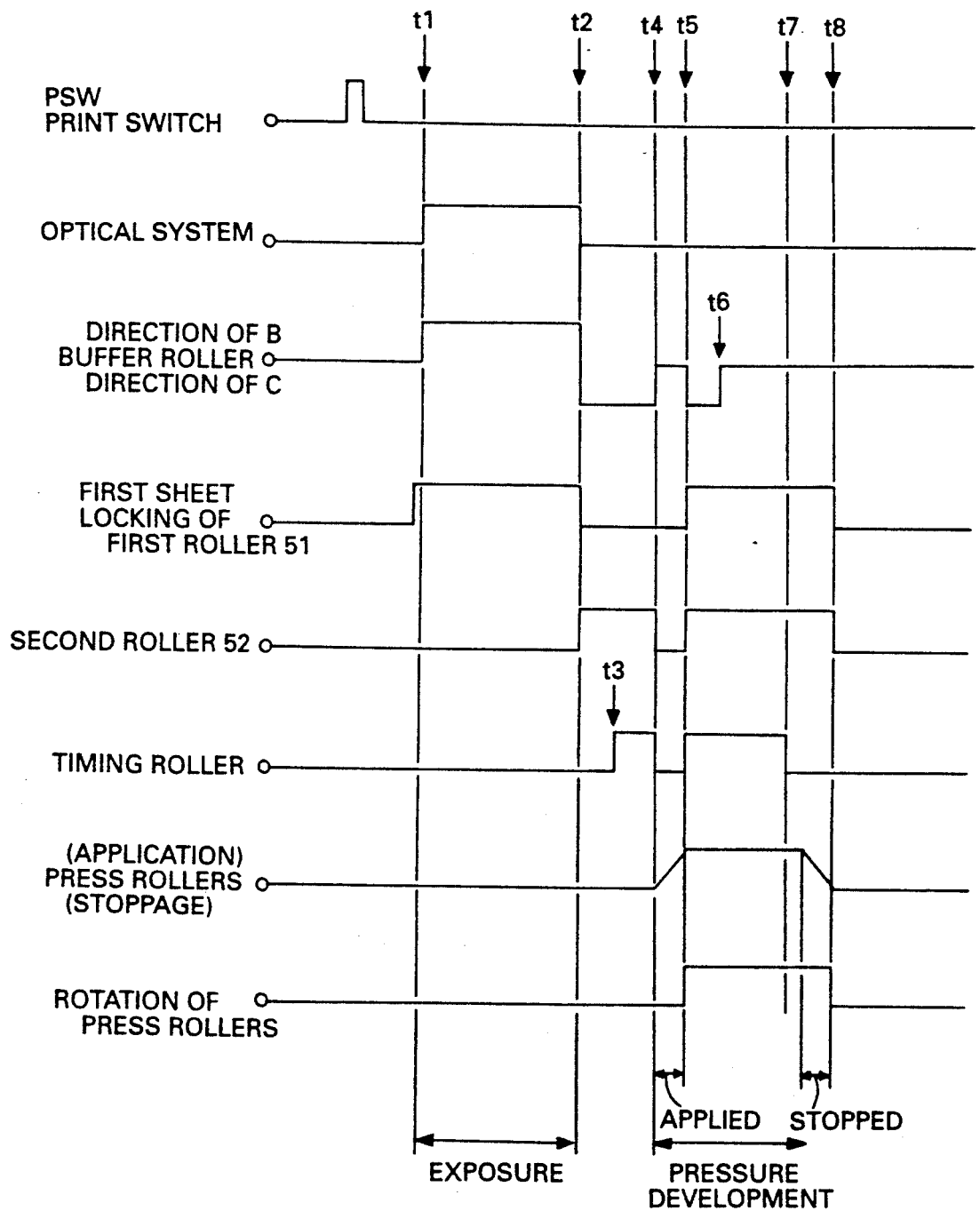
FIG. 1 is a timing diagram showing the steps of performing pressure development according to the present invention.
Figure 2A:
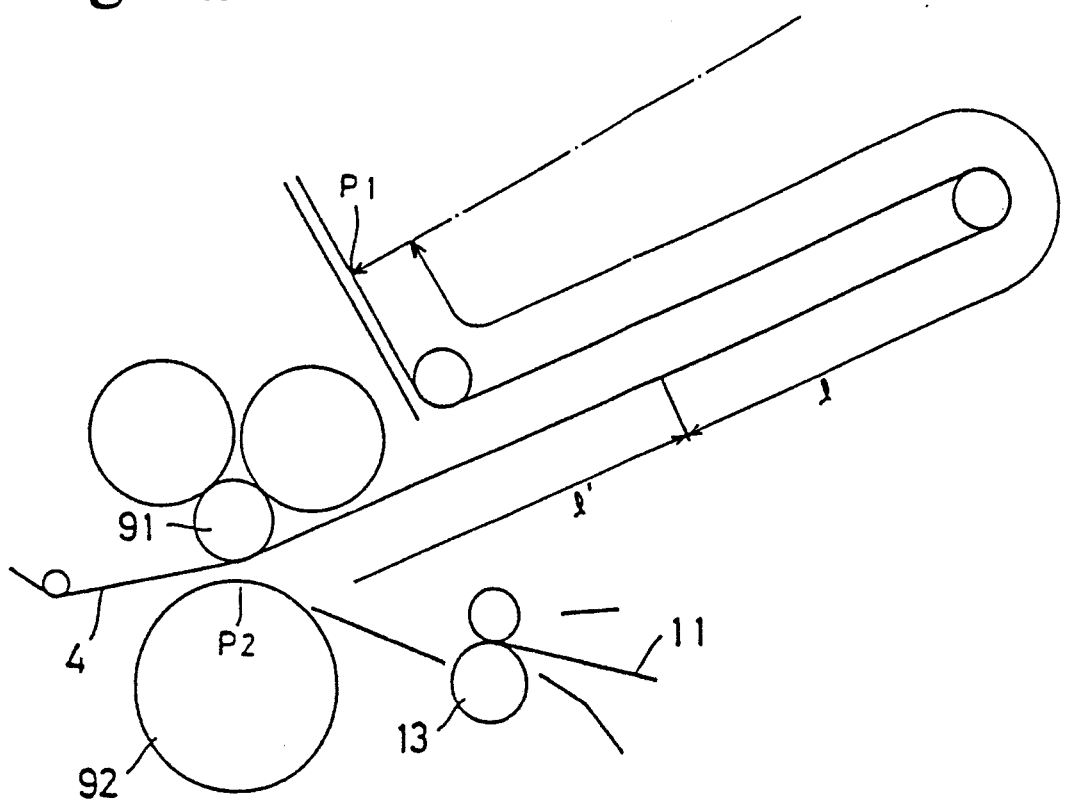
FIGS. 2A to 2C are diagrammatic views showing various modes of the pressure development unit.
Figure 2B:
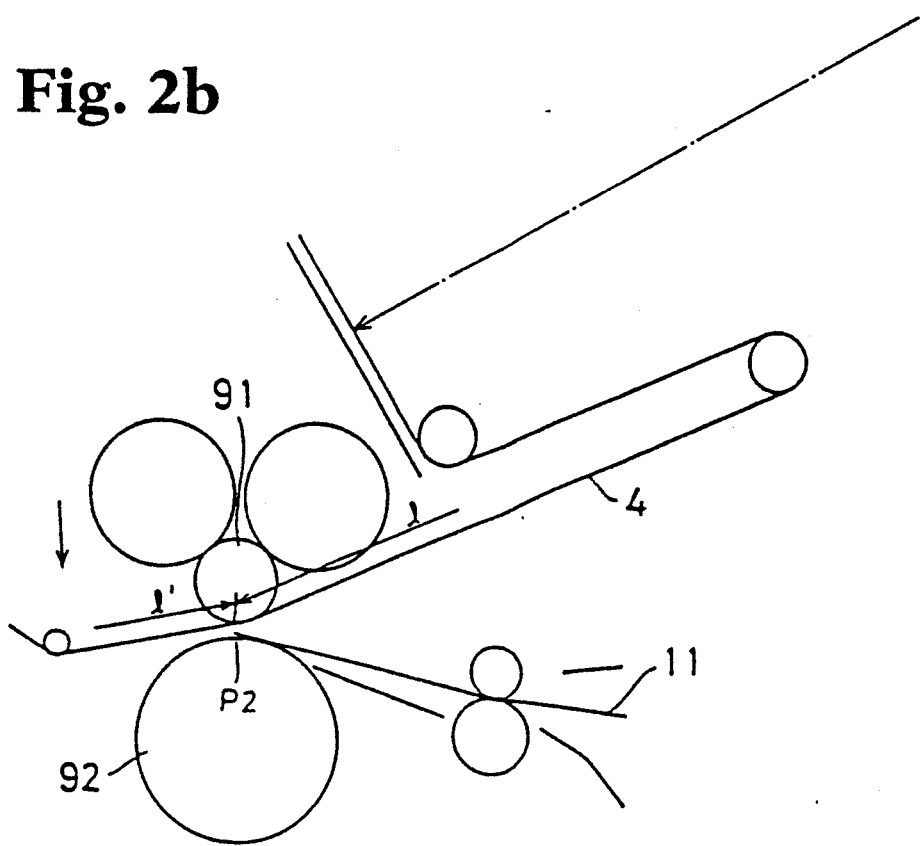

Referring to FIGS. 1 and 2A to 2C, which are respectively a timing diagram showing the conveyance of the first and second sheets, and schematic diagrams exemplifying the pressure development unit, the manner in which the conveyance is controlled will be described:

When a print switch is turned on, the clutch (not shown) sets the first roller 51 free, thereby allowing the second roller 52 to pull out the first sheet 4. The buffer roller 8 is moved in the direction of arrow (B) for a period of time t1 to t2 during which the first sheet 4 is exposed on the exposure plate 7 by the optical system (by the light reflected from the original (A) or directed through the slide). In this way a latent image is formed on the first sheet 4. The latent image occupies an area l on the first sheet 4 as shown in FIG. 2A. That portion of the image which is formed when the first sheet 4 is situated at the exposure point P1 is a forward portion of the image, and the preceding portion indicated by l' is a non-image area. In order to wind the non-image portion around the second roller 52, the buffer roller 8 is moved in the direction of arrow (C) while the first roller 51 is locked for the period of time t2 to t4, and when the forward end portion of the image 1 reaches the pressure point P2, the buffer roller 8 is stopped. As the buffer roller 8 is returned in the direction of (C), the first sheet 4 becomes loose, but the loose portion is wound around the second roller 52. At the time t3, the timing rollers 13 rotate and feed the second sheet 11 to the pressure point P2. At the time t4 when the forward end of the second sheet 11 reaches the pressure point P2, the timing rollers 13 are stopped. In this way the forward end portion of the image on the first sheet 4 and the forward end portion of the second sheet 11 overlap each other at the pressure point P2.

Figure 2C:
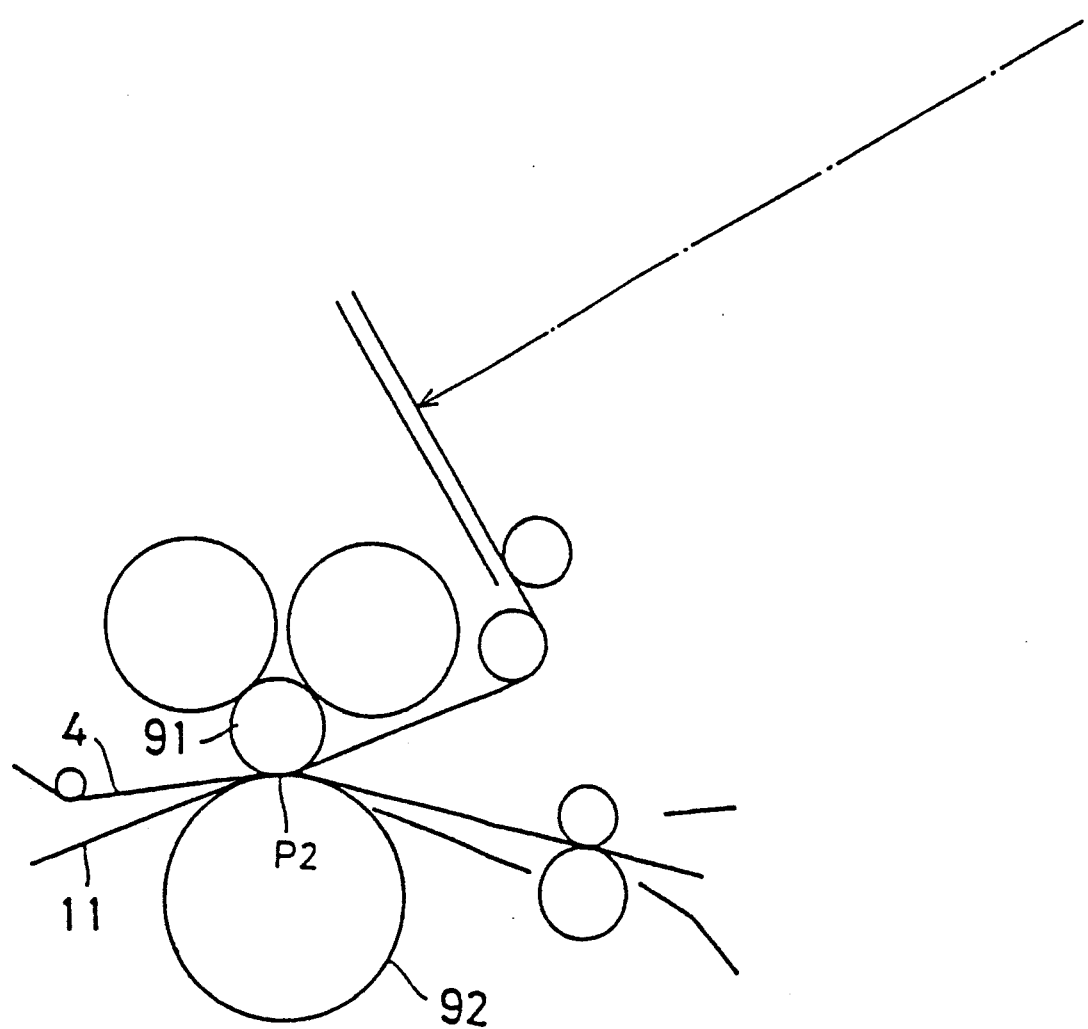

For the period of time t4 to t5, pressure is applied to the press rollers 91, 92 which nip the motionless composite sheet, thereby concentrating the pressure to the required area on the sheet. Then the press rollers 91 and 92 are rotated while the buffer roller 8 is moving in the direction of arrow (C). In this way the composite sheet is subjected to pressure development treatment (t5 to t7). Owing to the pressure provided by the press rollers 91 and 92, the capsules rupture and the dyestuff flows out. The dyestuff colors together with the developer on the second sheet 11 and forms a colored image on the second sheet 11. The buffer roller 8 returns to its original position at t6. Thereafter the pressure development treatment is continued by the rotating pressure rollers 91, and 92 with the buffer roller 8 staying at its initial position as shown in FIG. 2C.

At the time t7, the pressure development treatment is finished, and the press rollers 91, 92 are released from pressure while they continue to rotate to feed the first sheet 4 and the second sheet 11 to the respective discharging sections. It is of course possible to stop the pressure while the press rollers 91, 92 are at rest.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for developing a latent image under pressure, said latent image being formed of microcapsules curable by light, said microcapsules being pressure-rupturable and containing a chromagenic dyestuff, the method comprising the steps of passing a first sheet bearing the latent image through a pair of press rollers under non-pressure, stopping the conveyance of the sheet when an area of the sheet corresponding to the forward end of the latent image thereof reaches the nip between the pair of press rollers, feeding a developer sheet until a forward end thereof reaches the nip between the pair of press rollers so as to overlay the image-bearing portion of the firs sheet to form a composite sheet, applying pressure to the press rollers nipping the composite sheet at rest, and rotating the press rollers after the press rollers are put into a specified pressurizing state so as to feed the composite sheet under the specified pressure of the press rollers achieving substantially uniform pressure on and throughout the extent of the latent image.

2. A method for developing a latent image under pressure, the method comprising the steps of passing a double sheet through a pair of press rollers under non-pressure, the double sheet comprising a first sheet coated with pressure-rupturable microcapsules curable by light, said microcapsules containing chromagenic dyestuff and a second sheet coated with a developing medium, the first sheet being adapted to bear a latent image as a result of exposure to light, stopping the conveyance of the double sheet when an area of the first sheet corresponding to the forward end of the latent image thereof reaches the nip between the pair of press rollers, applying pressure to the press rollers nipping the double sheet, and rotating the press rollers after the press rollers are put into a specified pressurizing state so as to feed the double sheet under the specified pressure of the press rollers achieving substantially uniform pressure on and throughout the extent of the latent image.

3. A method according to claim 1 wherein the first sheet has a predetermined photosensitivity and further comprising the step of heating the first sheet so as to keep the first sheet at constant temperature and maintain the photosensitivity thereof irrespective of variations in temperatures, wherein the heating is initiated in response to the exposure of the first sheet to light.

4. A method for developing a latent image under pressure according to claim 1, including, when the rear end of the developer sheet reaches the nip between the pair of press rollers, stopping the conveyance of the first sheet and the developer sheet, and then releasing both of the sheets from the pressure applied by the press rollers.

5. A method for developing a latent image under pressure according to claim 1, including releasing the first and developer sheets from pressure by operating a cam mechanism which drives the rollers.

6. A method for developing a latent image under pressure according to claim 1, including, when the rear end of the developer sheet reaches the nip between the pair of press rollers, stopping the conveyance of the first sheet and the developer sheet, and then releasing both of the sheets from the pressure applied by the press rollers, including releasing the first and developer sheets from pressure by operating a cam mechanism which drives the rollers wherein when the rear end of the developer sheet reaches the nip between the pair of press rollers, the conveyance of the first sheet and the developer sheet is stopped, and then both of the sheets are released from pressure applied by the press rollers.

7. A method according to claim 1 wherein the step of passing the first sheet through the pair of press rollers occurs while the press rollers are non-rotating.

* * * * *